(12) United States Patent
Kwa (10) Patent No.: US 9,625,486 B2
(45) Date of Patent: *Apr. 18, 2017

(54) MEMS ACCELEROMETER

(71) Applicant: Meggitt (Orange County), Inc., Irvine, CA (US)

(72) Inventor: Tom Kwa, San Jose, CA (US)

(73) Assignee: MEGGITT (ORANGE COUNTY), INC., Irvine, CA (US)

( * ) Notice: Subject to any disclaimer, the term of this patent is extended or adjusted under 35 U.S.C. 154(b) by 97 days.

This patent is subject to a terminal disclaimer.

(21) Appl. No.: 14/334,599

(22) Filed: Jul. 17, 2014

(65) Prior Publication Data
US 2016/0018435 A1    Jan. 21, 2016

(51) Int. Cl.
| | | |
|---|---|---|
| *G01P 15/09* | (2006.01) | |
| *B81B 3/00* | (2006.01) | |
| *G01P 15/12* | (2006.01) | |
| *G01P 15/18* | (2013.01) | |
| *G01P 15/08* | (2006.01) | |

(52) U.S. Cl.
CPC .......... *G01P 15/09* (2013.01); *B81B 3/0035* (2013.01); *G01P 15/123* (2013.01); *B81B 2203/0338* (2013.01); *G01P 15/0802* (2013.01); *G01P 15/18* (2013.01); *G01P 2015/0837* (2013.01)

(58) Field of Classification Search
CPC ........ G01P 15/0802; G01P 2015/0837; G01P 2015/0862; G01P 15/09; G01P 15/123; G01P 15/18; B81B 3/0035; B81B 3/0054; B81B 3/0062; B81B 2201/0242; B81B 2203/0323; B81B 2203/0338; B81B 2203/053

USPC ............... 73/514.33, 514.34, 514.36, 514.38
See application file for complete search history.

(56) References Cited

U.S. PATENT DOCUMENTS

| | | | |
|---|---|---|---|
| 4,737,473 | A | 4/1988 | Wilner |
| 4,793,194 | A | 12/1988 | Wilner |
| 5,233,213 | A | 8/1993 | Marek |
| 5,261,277 | A | 11/1993 | Thomas et al. |
| 5,456,110 | A | 10/1995 | Hulsing, II |
| 5,905,203 | A | 5/1999 | Flach et al. |
| 6,230,566 | B1 | 5/2001 | Lee et al. |
| 7,743,661 | B2 | 6/2010 | Berthold et al. |
| 2002/0184949 | A1 | 12/2002 | Gianchandani et al. |
| 2004/0200281 | A1 | 10/2004 | Kenny et al. |
| 2005/0091843 | A1 | 5/2005 | Yu |
| 2005/0166677 | A1 | 8/2005 | Nasiri et al. |
| 2010/0300205 | A1* | 12/2010 | Kazama ................ G01P 1/023 73/514.33 |
| 2011/0006380 | A1* | 1/2011 | Hattori ............... G01P 15/0802 257/415 |
| 2012/0060605 | A1 | 3/2012 | Wu et al. |
| 2012/0132003 | A1 | 5/2012 | Comi et al. |

(Continued)

*Primary Examiner* — Benjamin Schmitt
(74) *Attorney, Agent, or Firm* — Hackler Daghighian Martino & Novack (57) ABSTRACT

A MEMS acceleration sensor comprising: a frame, a plurality of proofmasses; a plurality of flexures; a plurality of hinges and a plurality of gauges. The frame, proofmasses, flexures, hinges and gauges designed to measure acceleration in a direction perpendicular to the device plane while being generally resistant to motions parallel to the device plane. The measurement of the acceleration is accomplished through the piezoresistive effect of the strain in the gauges.

20 Claims, 8 Drawing Sheets

(56) References Cited

U.S. PATENT DOCUMENTS

| | | | |
|---|---|---|---|
| 2012/0262026 A1* | 10/2012 | Lin | B81B 3/0072 |
| | | | 310/300 |
| 2013/0247667 A1 | 9/2013 | Malvern | |
| 2014/0041452 A1 | 2/2014 | Westberg et al. | |
| 2015/0346235 A1* | 12/2015 | Kwa | B81B 3/0021 |
| | | | 73/514.33 |

* cited by examiner

MEMS ACCELEROMETER

FIELD

The present patent document relates to micro-electro-mechanical ("MEMS") accelerometers. More particularly, the present patent document relates to accelerometers with freed gauges sensitive to accelerations perpendicular to the device plane.

BACKGROUND

An accelerometer is a transducer that converts acceleration forces into electronic signals. Accelerometers are applied and used in a variety of devices. For example, accelerometers are often included in automobile systems for air-bag deployment and roll-over detection. Accelerometers are also used in computer devices, such as for motion-based sensing (e.g. for drop detection) and motion-based control (e.g. in gaming).

A MEMS accelerometer typically includes, among other things, a proofmass and one or more sensors for sensing movement or changes in position of the proofmass that are induced by external accelerations. A MEMS accelerometer can be configured to sense acceleration along one or more axes. Typically, the proofmass is configured in a predetermined device plane, and the axes of sensitivity are referenced relative to this device plane. For example, accelerations sensed along an axis or axes parallel to the device plane are usually referred to as X-or Y-axis accelerations, and accelerations sensed along an axis perpendicular to the device plane are usually referred to as Z-axis accelerations. A single-axis accelerometer might be configured to detect only X-or Y-axis accelerations or only Z-axis accelerations. A two-axis accelerometer might be configured to detect X-and Y-axis accelerations or configured to detect X-and Z-axis accelerations. A three-axis accelerometer might be configured to detect all three of X-, Y-, and Z-axis accelerations.

In the MEMS field, using a pressure-or force-sensitive element, such as a cantilever, in conjunction with a strain-sensing element for measuring acceleration, force, or pressure, is known in the art. Accelerations on the strain-sensing element along the relevant axis will put that element into tension or compression, thereby changing the element's cross-sectional area and the resistance to the flow of electrical current in proportion to the acceleration. The change in resistance is measured using techniques such as a Wheatstone bridge to determine the amount of acceleration.

Prior attempts to achieve high sensitivity in acceleration sensors have been plagued by susceptibility to cross-axis, i.e. out-of-plane, accelerations. Thus, there is a need for a MEMS accelerometer that is sensitive to Z-axis accelerations, i.e. accelerations sensed along an axis perpendicular to the device plane, while being insensitive to X-and Y axis accelerations, i.e. accelerations sensed along an axis or axes parallel to the device plane.

SUMMARY OF THE EMBODIMENTS

In view of the foregoing, an object according to one aspect of the present patent document is to provide a MEMS device for detecting accelerations along an axis perpendicular to the device plane; that is, vertical accelerations along the Z-axis. Preferably the methods and apparatuses address, or at least ameliorate, one or more of the problems described above. To this end, a MEMS acceleration sensor is provided.

In one embodiment, the MEMS acceleration sensor comprises: a frame; a first proofmass located within the frame, the first proofmass separated from the frame by a gap, wherein the first proofmass includes a left side, right side, top, bottom, horizontal midline halfway between the top and the bottom and vertical midline halfway between the left side and right side; a first channel starting from the top of the first proofmass and extending down into the first proofmass towards the bottom past the horizontal midline to a first channel end, the first channel located right of the vertical midline; a second channel starting from the bottom of the first proofmass and extending up into the first proofmass towards the top past the horizontal midline to a second channel end, the second channel located left of the vertical midline; a third channel starting from the right side of the first proofmass and extending in towards the first channel along the top of the first proofmass; a fourth channel starting from the right side of the first proofmass and extending in towards the first channel along the bottom of the first proofmass; a third channel starting from the right side of the first proofmass and extending in towards the first channel along the top of the first proofmass; a fourth channel starting from the right side of the first proofmass and extending in towards the first channel along the bottom of the first proofmass; a fifth channel starting from the left side of the first proofmass and extending in towards the second channel along the top of the first proofmass; a fifth channel starting from the left side of the first proofmass and extending in towards the second channel along the top of the first proofmass; four flexures, each flexure located within one of the third, fourth, fifth and sixth channels and coupling the first proofmass to the frame; a second proofmass located within the first channel and coupled to the first proofmass via a first hinge and a first pair of gauges at the first channel end and, coupled to the frame at the top via a second hinge and a second pair of gauges; and a third proofmass located within the second channel and coupled to the first proofmass via a third hinge and a third pair of gauges at the second channel end and coupled to the frame at the bottom via a fourth hinge and a fourth pair of gauges.

In preferred embodiments of the MEMS acceleration sensor, the combination of the hinges and flexures are designed to allow the first proofmass to translate relative to the frame in a direction perpendicular to a device plane and restrict motion parallel to the device plane. In a preferred embodiment, hairsprings may be used for the flexures. In yet another embodiment a coiled spring may be used. In yet other embodiments, other types of flexures may be used.

In a preferred embodiment, the hinges that connect the first proofmass to the frame are primarily responsible for controlling the motion perpendicular to the device plane. Although the flexures may contribute to controlling the motion of the first proofmass, in a preferred embodiment, the primary purpose of the flexures is to provide an electrical path from the frame to the first proofmass. Accordingly, in a preferred embodiment, the spring constant of the flexures is smaller than the spring constant of the hinges. In an even more preferred embodiment, the spring constant of the flexures is at least 50%, 80% or even 95% smaller than the spring constant of hinges.

In some embodiments of the MEMS acceleration sensor, rather than having a single pair of gauges at a particular location, multiple pairs of gauges may be used. However, using a single pair or more than two pairs in any one location is acceptable in other embodiments. In yet other embodiments, some gauge locations may use a single pair of gauges while other gauge locations use multiple pairs of gauges.

In preferred embodiments, the gauges are made of a piezoresistive material and the movement of the first proofmass relative to the frame causes a piezoresistive effect in at least one of the gauges.

Generally, the proofmasses may be of any shape. However, in preferred embodiments, the second proofmass and third proofmass are rectangular cuboids. In yet other embodiments, the first proofmass is also a rectangular cuboid. In yet other embodiments, other shapes may be used.

In preferred embodiments, the frame is a stationary rim and used as a mounting location for the MEMS acceleration sensor. In yet other embodiments, mounting locations may be appended to the frame.

The MEMS acceleration sensor can have any size and shape. As just one example of the size and shape, the frame of the MEMS acceleration sensor has a length of approximately 6 millimeters, a width of approximately 3 millimeters, and a thickness of approximately 1 millimeter.

In preferred embodiments, the hinges couple the second and third proofmasses to the frame and the main proofmass. In a preferred embodiment, the hinges are located above a centerline of a thickness of the first proofmass. The centerline of thickness is hallway through the thickness of the proofmass in a direction perpendicular to the device plane.

In another aspect of the embodiments disclosed herein, a MEMS acceleration sensor is disclosed that comprises: a frame; a first proofmass located within the frame comprising a large center block flanked on a right side by a rectangular right side block and flanked on a left side by a rectangular left side block wherein, the right side block is separated from the center block by a first slit that cuts in from a top of the first proofmass such that the right side block is coupled to the center block by a first bridge at a bottom of the first proofmass and wherein the left side block is separated from the center block by a second slit that cuts in from the bottom of the first proofmass such that the left side block is coupled to the center block by a second bridge at the top of the first proofmass; a second proofmass located in the first slit, the second proofmass coupled to the frame by a first hinge along the top of the first proofmass and coupled to the first bridge by a second hinge; a third proofmass located in the second slit, the third proofmass coupled to the frame by a third hinge along the bottom of the first proofmass and coupled to the second bridge by a third hinge; a first pair of gauges located above the first hinge and spanning between the second proofmass and the frame; a second pair of gauges located above the second hinge and spanning between the second proofmass and the first proofmass; a third pair of gauges located above the third hinge and spanning between the third proofmass and the frame; a fourth pair of gauges located above the fourth hinge and spanning between the third proofmass and the first proofmass; and, a plurality of flexures that couple the first proofmass to the frame.

In yet another aspect of the present patent document, a MEMS acceleration sensor is provided. In a preferred embodiment, the MEMS acceleration sensor comprises: a frame; a first proofmass located within the frame; a second proofmass nested within three sides of the first proofmass; a third proofmass nested within three sides of the first proofmass; four flexures that couple the first proofmass to the frame; a hinge and a pair of gauges that couple the second proofmass to the frame; a hinge and a pair of gauges that couple the third proofmass to the frame; a hinge and a pair of gauges that couple the second proofmass to the first proofmass; and a hinge and a pair of gauges that couple the third proofmass to the first proofmass.

As described more fully below, the apparatuses of the embodiments of the MEMS acceleration sensors help solve or at least ameliorate problems with prior accelerometers. Further aspects, objects, desirable features, and advantages of the apparatuses disclosed herein will be better understood from the detailed description and drawings that follow in which various embodiments are illustrated by way of example. It is to be expressly understood, however, that the drawings are for the purpose of illustration only and are not intended as a definition of the limits of the claimed embodiments.

DETAILED DESCRIPTION OF THE EMBODIMENTS

Figure 1A:
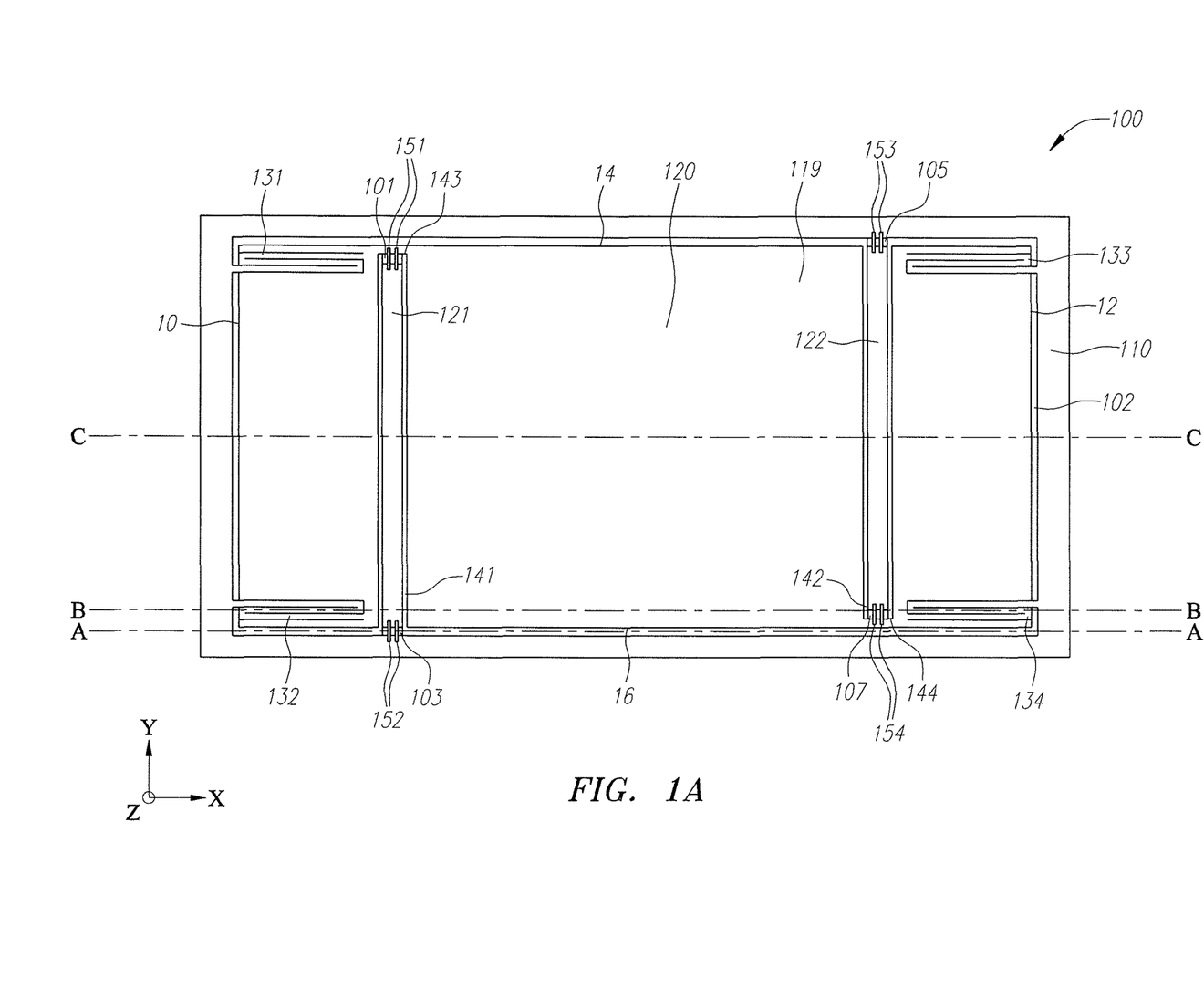
FIG. 1A illustrates a top surface view of one embodiment of a MEMS acceleration sensor.
Figure 1B:
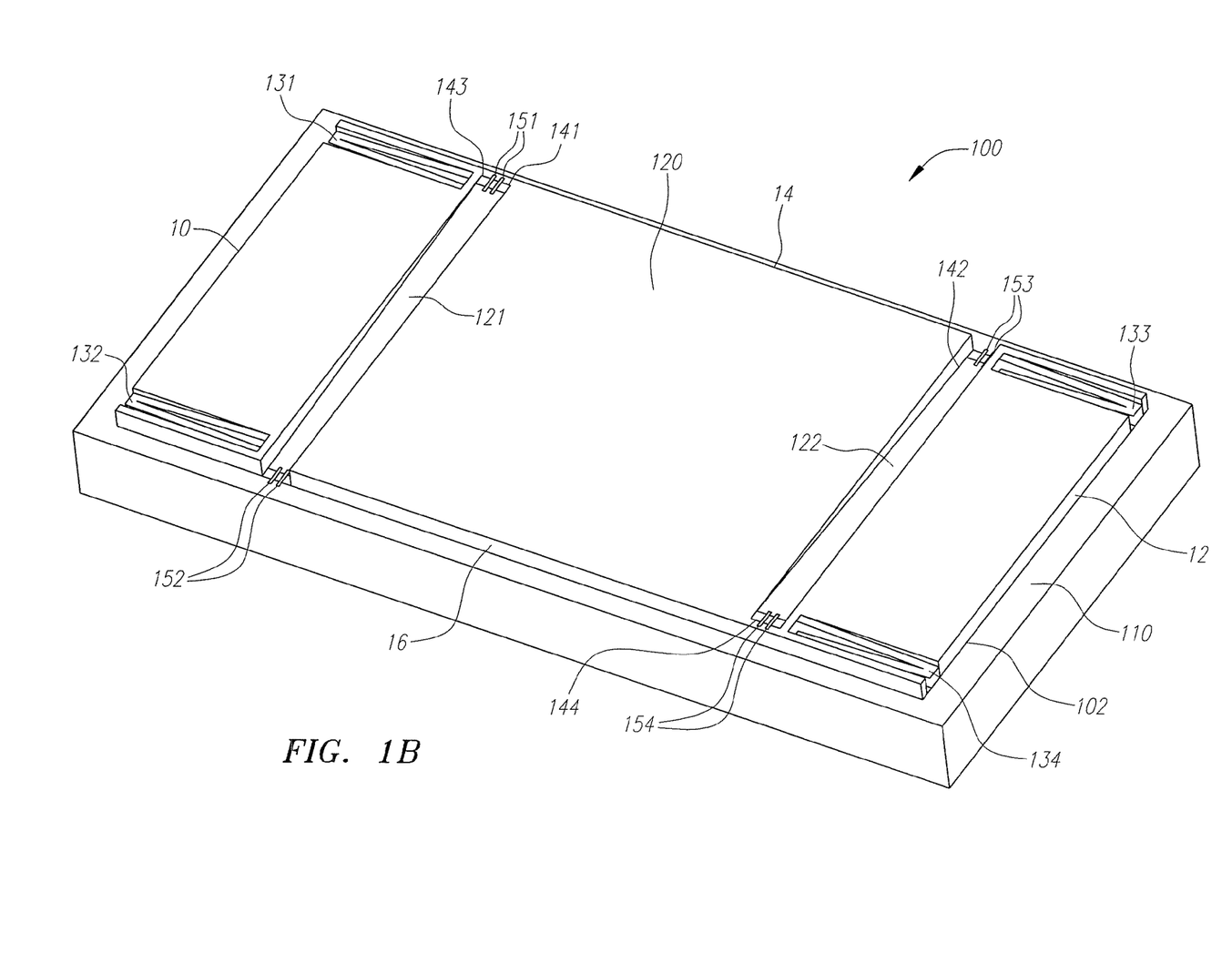
FIG. 1B illustrates an isometric view of the MEMS acceleration sensor of FIG. 1A.
Figure 1C:
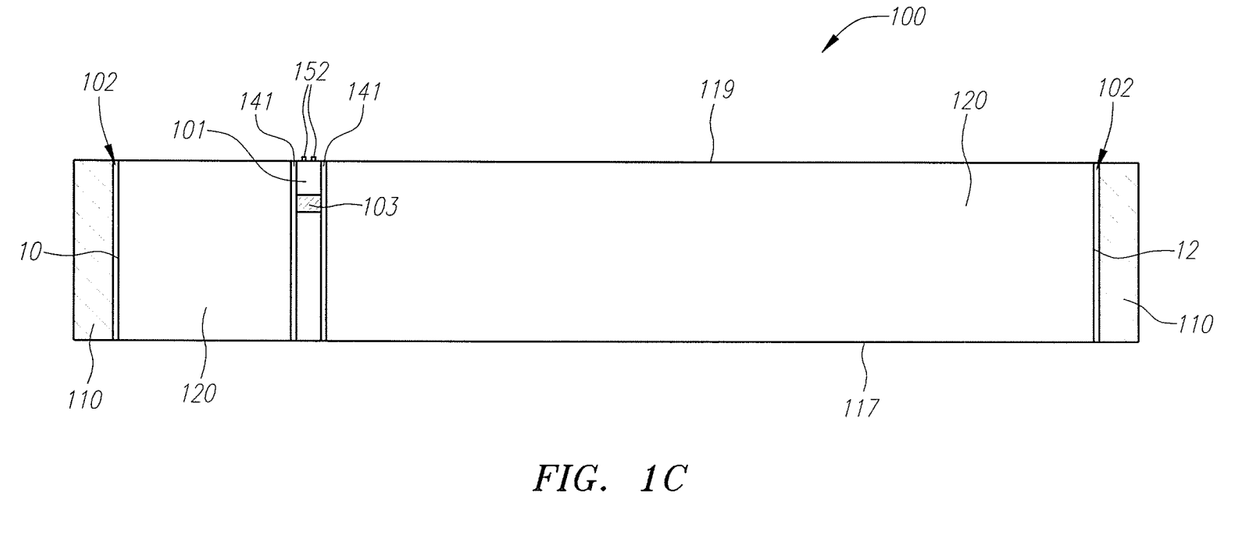
FIG. 1C illustrates a cross-sectional view A-A of the embodiment of a MEMS acceleration sensor shown in FIG. 1A.
Figure 1D:
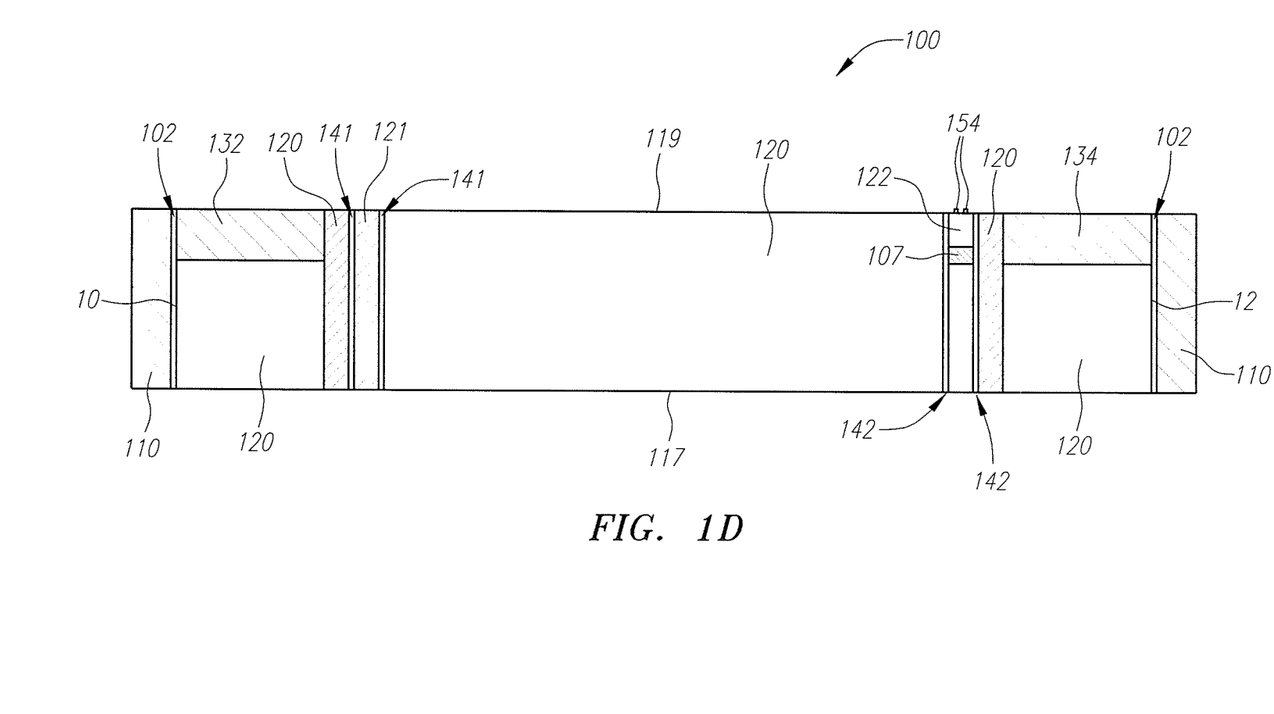
FIG. 1D illustrates a cross-sectional view B-B of the embodiment of a MEMS acceleration sensor shown in FIG. 1A.
Figure 1E:
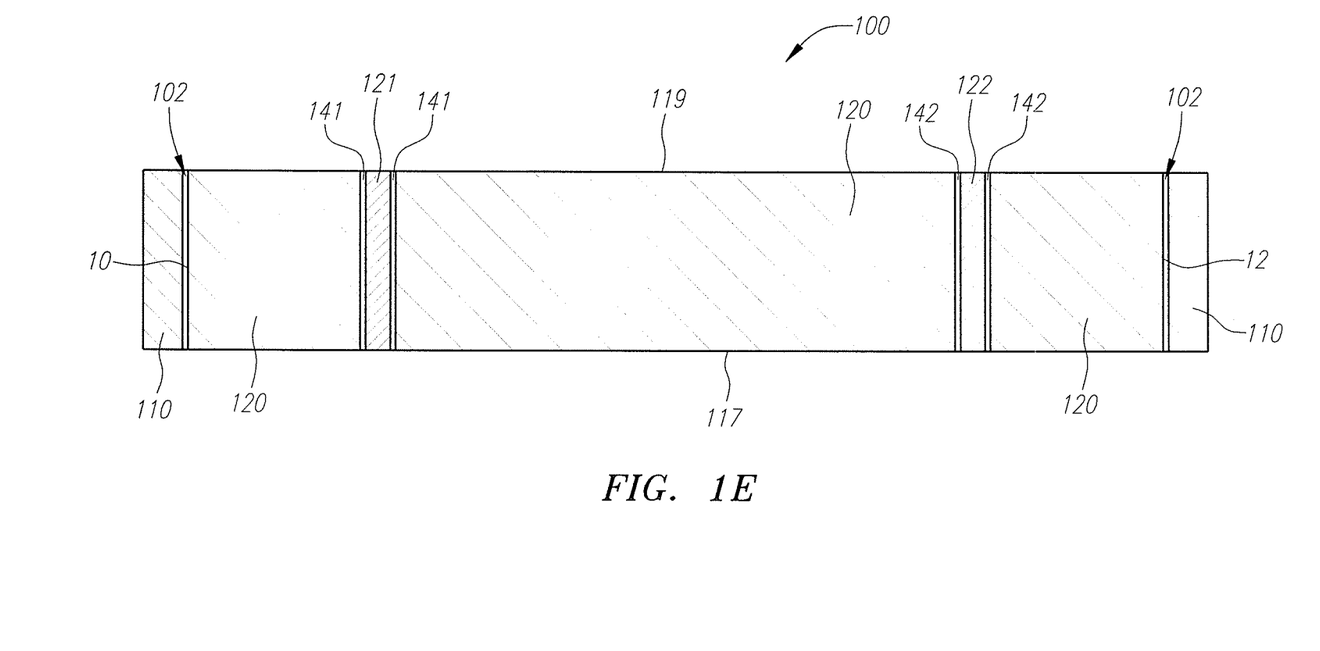
FIG. 1E illustrates a cross-sectional view C-C of the embodiment of a MEMS acceleration sensor shown in FIG. 1A.

FIG. 1A illustrates a top surface view looking down on the device plane of one embodiment of a MEMS accelerometer as taught herein. MEMS acceleration sensor 100 includes the top surface 119. FIG. 1B illustrates an isometric view of the MEMS acceleration sensor 100 in FIG. 1A. FIGS. 1C, 1D, and 1E illustrate different cross-sectional views A-A, B-B, and C-C of the embodiment of the MEMS acceleration sensor 100 in FIGS. 1A and 1B.

In the embodiment of the MEMS acceleration sensor 100 shown in FIGS. 1A-1E, the acceleration sensor 100 includes frame 110; proofmasses 120, 121, and 122; flexures 131, 132, 133, and 134; channels 141 and 142; hinges 101, 103, 105 and 107; and pairs of gauges 151, 152, 153, and 154. Proofmass 120 has a left side 10, right side 12, top 14, and bottom 16, and is located within frame 110.

The flexure 131 is located near the top 14 of proofmass 120 and couples the left side 10 of the proofmass 120 to the frame 110. Flexure 132 is located near the bottom 16 of proofmass 120 and couples the left side 10 of the proofmass 120 to the frame 110. In the embodiment shown in FIG. 1A, flexures 133 and 134 are in mirrored symmetry to flexures 131 and 132 and provide the same function on the other side of the proofmass 120. Flexures 133 and 134 are thus mirrored about the vertical midline of the proofmass 120. To this end, flexure 133 is located near the top 14 of proofmass 120 and couples the right side 12 of the proofmass 120 to the frame 110. Flexure 134 is located near the bottom 16 of proofmass 120 and couples the right side 12 of the proofmass 120 to the frame 110.

In the embodiment in FIG. 1A, the proofmass 120 has a couple channels 141 and 142 cut into it. The channels 141 and 142 may be also referred to as slits. Channel 141 starts from the bottom 16 of proofmass 120 and extends up to a channel end 143. In a preferred embodiment, channel 141 extends towards the top of proofmass 120 past the horizontal midline. Also in a preferred embodiment, channel 141 is located left of the vertical midline of the proofmass 120 such that it is on the left side of proofmass 120. Channel 142 starts at the top 14 of the proofmass 120 and extends down to a channel end 144. In a preferred embodiment, channel 142 extends towards the bottom of proofmass 120 past the horizontal midline. Also in a preferred embodiment, channel 142 is located right of the vertical midline of the proofmass 120 such that it is on the right side of proofmass 120.

The channels 141 and 142 each extend across the proofmass 120. In a preferred embodiment, the channels extend almost entirely across the proofmass 120. In a more preferred embodiment, the channels 141 and 142 extend at least 80% of the way across proofmass 120. In an even more preferred embodiment, the channels 141 and 142 extend at least 90% of the way across the proofmass 120. In yet even more preferred embodiments, the channels 141 and 142 extend at least 95% or at least 99% of the way across proofmass 120. In yet other embodiments, the channels 141 and 142 only extend up to the horizontal centerline of proofmass 120.

In preferred embodiments, a proofmass 121 and 122 is contained within each channel 141 and 142. As may be seen in FIG. 1A, proofmass 121 is located within channel 141. In a preferred embodiment, the proofmasses 121 and 122 are not touching the sides of their respective channels 141 and 142 but instead, are coupled to the proofmass 120 by a hinges 101 and 107 at their respective channel ends 143 and 144. In addition, proofmasses 121 and 122 are coupled to the frame on their opposite sides from the channel ends by additional hinges 103 and 105 respectively.

As may be seen in FIG. 1A, in a preferred embodiment, above each hinge in the direction of the device plane is a pair of gauges. However, using more than one pair of gauges in any one location is acceptable in other embodiments. In yet other embodiments, some gauge locations may use a single pair of gauges while other gauge locations use multiple pairs of gauges.

In the embodiment shown in FIG. 1A, a pair of gauges 151, couple the proofmass 121 to the proofmass 120 at channel end 143. Proofmass 121 is further coupled to the frame 110 at the opposite end from hinge 101 by hinge 103 and pair of gauges 152. Proofmass 122 is located within channel 142, and is coupled to proofmass 120 via hinge 107 and pair of gauges 154 at channel end 144. Proofmass 122 is further coupled to the frame 110 at the opposite end from hinge 107 via hinge 105 and pair of gauges 153.

In the preferred embodiment, proofmasses 120, 121, and 122 are formed from the wafer layer of a silicon wafer. In a preferred embodiment, proofmasses 120, 121, and 122 are formed by etching away the material between the proofmasses and between the proofmasses and the frame 110, as shown in FIG. 1A. The removal of the material forms channels 141 and 142. In a preferred embodiment, during the etching process, hinges 101, 103, 105, and 107 are left in the spaces between the proofmasses, and the spaces between the proofmasses and the frame 110, as shown. As may be seen in cross sections A-A and B-B shown in FIGS. 1C and 1D, in a preferred embodiment, the hinges are formed above a centerline of a thickness of the proofmass 120. The centerline of the thickness of the proofmass 120 being defined by the halfway point between the top surface 119 and the bottom surface 117 of the proofmass 120. In a preferred embodiment, the hinges 101, 103, 105, and 107 are formed by etching both down from the top surface 119 and up from the bottom surface 117.

In a preferred embodiment, pairs of gauges 151, 152, 153, and 154 are formed from the device layer of a silicon wafer. In an even more preferred embodiment, pairs of gauges 151, 152, 153, and 154 are pairs of freed gauges. Free gauges are described in U.S. Pat. Nos. 4,498,229 and 4,737,473, which are herein incorporated by reference in their entirety.

As may be seen in FIG. 1A, in a preferred embodiment, the frame 110 and the proofmass 120 are connected by flexures 131, 132, 133, and 134. In some embodiments, during manufacture, the frame and proofmasses all start from a single contiguous piece of silicon wafer.

In operation, an acceleration in the Z or -Z direction of FIG. 1A causes proofmass 120 to move in a direction perpendicular to the device plane—in the Z or -Z direction—relative to the frame 110. The movement of proofmass 120 perpendicular to the device frame can occur in either an upwards or a downwards direction. In such embodiments, the gauges 151, 152, 153, and 154 are made of a piezoresistive material. Accordingly, an acceleration in the Z or -Z direction causes vertical movement of the proofmass 120 relative to the frame 110, which in turn causes a piezoresistive effect in at least one of the gauges 151, 152, 153, and 154. At the same time, in preferred embodiment, the flexures resist movement parallel to the device plane. Thus, MEMS acceleration sensor 100 is sensitive to accelerations in a single axis perpendicular to the device plane that result in vertical movement of the proofmass 120 along the Z-axis, but is insensitive to accelerations in the X or Y axis, as shown in FIG. 1A.

The proofmass 120 is isolated from the frame by a gap except for a single connection by a hinge 103, 105 and a pair of gauges 152, 153 on the top and bottom of the proofmass 120, and the four flexures 131, 132, 133 and 134. As will be explained in more detail below, in a preferred embodiment the main purpose of the four flexures is to provide an electrical path from the frame 110 to the proofmass 120. Although the flexures may contribute to the motion of proofmass 120, in a preferred embodiment, they contribute very little. In a preferred embodiment, the hinges 103 and 105 that connect the proofmass 120 to the frame 110 are primarily responsible for the motion of the proofmass 120 perpendicular to the device plane and relative to the frame 110. Accordingly, in a preferred embodiment, the spring constant of the flexures 131, 132, 133 and 134 is smaller than the spring constant of the hinges 103 and 105. In an even more preferred embodiment, the spring constant of the flexures is at least 50%, 80% or even 95% smaller than the spring constant of hinges.

In a preferred embodiment, the combinational effect of both the hinges 103 and 105 and the flexures 131, 132, 133 and 134 control the motion of the proofmass 120 in a direction perpendicular to the device plane and relative to the frame 110.

The routing of the electrical currents will now be explained. The electrical currents must traverse from the frame 110 through the gauges 151, 152, 153 and 154 over the spaces above each of the hinges 101, 103, 105 and 107 and back to the frame 110. However, two of those pairs of gauges 151 and 154 are not connect to the frame but rather couple the proofmass 120 to the proofmasses 121 and 122 respectively. To this end, a paths must be provided to get the electrical currents from proofmass 120 back to the frame 110. In a preferred embodiment, these paths are provided by the flexures 131, 132, 133 and 134. As just one example of a possible electrical routing, the path may begin on the frame 110 in the top left corner by hairspring 131. The path travels from the frame 110 over the hairspring 131 to the proofmass 120. The path then proceeds from the proofmass 120 across the first gauge of the pair of gauges 151 onto the proofmass 121. The path then u-turns or doubles back over the second gauge of the pair of gauges 151 back onto the proofmass 120. The path may then proceed to the bottom left corner of proofmass 120 and back across the hairspring 132 to the frame 110. Accordingly, a path is provided from the frame 110, to proofmass 120, across gauge 151 to proofmass 121 and back again.

The pair of gauges 152 on the opposite side of proofmass 121 have a direction connection to the frame 110. Accordingly, the electrical path may go directly from the frame through the first gauge in the pair of gauges 152 to proofmass 121 and back to the frame 110 over the second gauge of the pair of gauges 152. In a preferred embodiment, the electrical path from the frame 110 to proofmass 122 across gauges 153 and 154 happens in mirrored symmetry to the paths just explained but over hairsprings 133 and 134.

FIG. 1B shows the MEMS acceleration sensor of FIG. 1A under a 2 g (1 g=9.81 m/s$^2$) acceleration along the Z axis. In a preferred embodiment, the MEMS acceleration sensor is designed to be sensitive to a 2 g acceleration. However, in other embodiments, the MEMS acceleration sensor may be designed to work with any size acceleration. For example, the MEMS acceleration sensor may be designed to work with <1 g, 1 g, 2 g, 5 g, 10 g or even 100 g.

As shown in FIG. 1B, when, for example, a negative acceleration is applied along the Z axis to MEMS acceleration sensor 100, proofmass 120 moves perpendicular to the device plane relative to the frame 110. The combined effects of the hinges 101, 103, 105 and 107 and the flexures 131, 132, 133 and 134 allow the proofmass 120 to move relative to the frame and restricting the movement to primarily the Z axis. The movement of proofmass 120 causes the ends of the proofmasses 121 and 122 connected to the proofmass 120 through hinges 101 and 107 to be displaced. At the same time, the opposite end of each of proofmasses 121 and 122 connected to the frame 110 via hinges 103 and 105, experience almost no displacement. Accordingly, gauges 152 and 153 experience very little stress while gauges 151 and 154 are caused to stretch and come into tension. The tension of the gauges causes a change in resistance within the gauges 151 and 154 to the flow of electrical current, in proportion to the magnitude of the acceleration. In a preferred embodiment, gauges 151, 152, 153, and 154 are made of a piezoresistive material, and vertical movement of proofmass 120 causes a measurable piezoresistive effect in at least one of the gauges 151, 152, 153, and 154.

In a preferred embodiment, such as the one shown in FIG. 1A, the channels 141 and 142 are rectangles and proofmasses 121 and 122 are rectangular cuboids. However, in other embodiments, channels 141 and 142 may be other shapes and/or proofmasses 121 and 122 may be of other shapes, such as cylinders, triangular prisms, trapezoidal prisms, or cubes.

In one embodiment, frame 110 is a stationary rim with a length of approximately 6 millimeters, a width of approximately 3 millimeters, and a thickness of approximately 1 millimeter. Of course, embodiments of other sizes may be made without departing from the scope of the present patent document. Thus, in other embodiments, frame 110 may have a length greater or less than 6 millimeters, a width greater or less than 3 millimeters, and a thickness greater or less than 1 millimeter. Also, in other embodiments, the frame may be square such that the length and width are the same.

FIG. 1C illustrates a cross-sectional view of cross section A-A shown in FIG. 1A. Cross section A-A cuts parallel to top 14 and bottom 16, and across the gap between the bottom of proofmass 120 and frame 110. As may be seen in FIG. 1C, the channel 141 extends the full length of the wafer such that proofmass 121 is completely separate from proofmass 120 along the sides of proofmass 121. FIG. 1C illustrates hinge 103 and pair of gauges 152. Hinge 103 and pair of gauges 152 couple proofmass 121 to the frame 110. A similar coupling occurs between proofmass 121 and proofmass 120 on the opposite end of proofmass 121. As may also be seen in FIG. 1C, hinge 103 is preferably located above a centerline of the thickness of proofmass 120.

FIG. 1D illustrates a cross-sectional view of cross section B-B shown in FIG. 1A. Cross section B-B cuts parallel to top 14 and bottom 16, and across the channel 142 between the end of proofmass 122 and proofmass 120. As may be seen in FIG. 1D, the channel 142 extends the full length of the wafer along the sides of proofmass 122. Accordingly, proofmass 122 is completely separate from proofmass 120 and frame 110 other than the connection through the hinges 105 and 107 and the pairs of gauges 153 and 154.

In a preferred embodiment, flexures 131, 132, 133, and 134 are of a height such that they extend from the level of top surface 119 to the level of the bottom of hinges 101, 103, 105, and 107. As FIG. 1D shows, for example, flexures 132 and 134 have a height such that they extend from the top surface 119 to the bottom of hinge 107. In other embodiments, the thickness of flexures 131, 132, 133 and 134 may be different thicknesses.

In a preferred embodiment, flexures 131, 132 133 and 134 are hairsprings. In other embodiments, the flexures may be another type of spring such as a coil spring. Flexures 131, 132, 133 and 134 may be any type of flexure that allows translation in one axis and resists translation or ration in the other axes.

FIG. 1E illustrates a cross-sectional view C-C from FIG. 1A. Cross section C-C cuts parallel to top 14 and bottom 16 at about a mid-point between top 14 and bottom 16.

The frame 110 in the embodiment shown in FIGS. 1A, 1B, 1C, 1D, and 1E, is in the shape of a rectangular cuboid. However, other shapes may be used. For example, the frame 110 may be a cube, circle, rhombus, or be any other shape having any number of sides. In a preferred embodiment, however, the frame 110 is a rectangular cuboid.

In the embodiment shown in FIGS. 1A, 1B, 1C, 1D, and 1E, proofmass 120 is located at equal distances from the frame 110 on the left side, right side, top, and bottom. The proofmass 120 is offset from the frame 110 or separated from the frame 110 by gap 102. In a preferred embodiment, gap 102 is formed by etching in a similar manner to channels 141 and 144. However, in other embodiments, proofmass 120 may not be equally spaced from the frame 110 on the left side, right side, top, and bottom. For example, proofmass 120 may be a shorter distance from the frame 110 at the top than it is from the bottom. In such cases, proofmass 120 may be located off-center.

Figure 2:
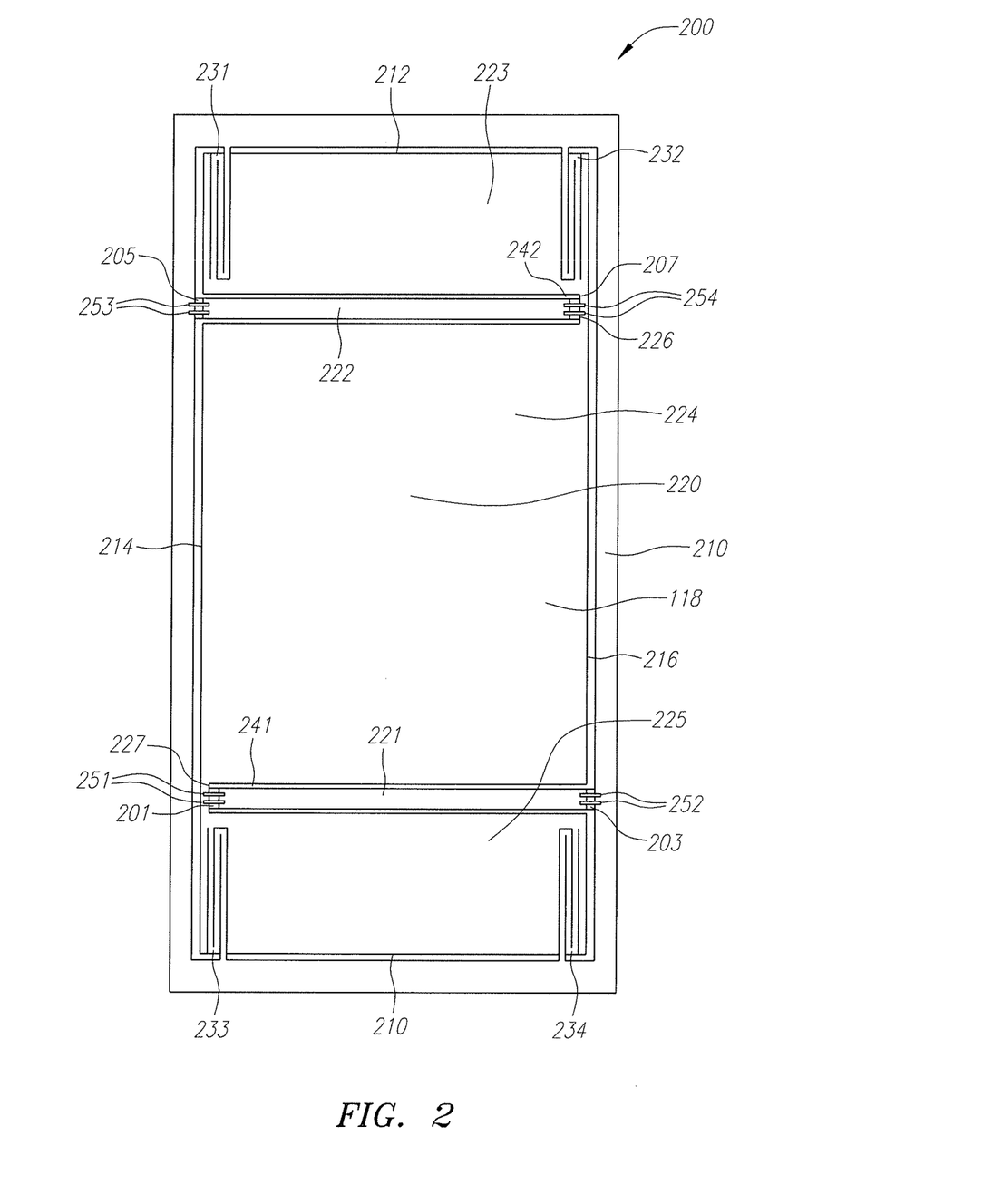
FIG. 2 illustrates a top view of one embodiment of a MEMS acceleration sensor.

FIG. 2 illustrates a view of the top surface 119 of another embodiment of a MEMS acceleration sensor 200. The embodiment shown in FIG. 2 is similar to the embodiment shown in FIG. 1 except that the embodiment has been rotated in the view 90 degrees counter-clockwise. However, in order to clarify the embodiments disclosed herein, the description of the embodiment shown in FIG. 2 will incorporate alternative language for some of the elements compared to the description of the embodiment shown in FIG. 1.

The instant embodiment of MEMS acceleration sensor 200 shown in FIG. 2 includes frame 210; proofmass 220; rectangular cuboid proofmasses 221 and 222; flexures 231, 232, 233, and 234; hinges 201, 203, 205, and 207; pairs of gauges 251, 252, 253, and 254; and channels 241 and 242. Proofmass 220 is located within the frame 210 and includes a top horizontal piece 223, center rectangular piece 224, bottom horizontal piece 225, bridge piece 226 that connects top horizontal piece 223 to center rectangular piece 224, and bridge piece 227 that connects center rectangular piece 224 to bottom horizontal piece 225. Proofmass 220 has a left side 214, right side 216, top 212, and bottom 210. Flexure 231 is located near the left side 214 and couples the top horizontal piece 223 to the frame 210, and flexure 232 is located near the right side 216 and couples the top horizontal piece 223 to the frame 210. Similarly, flexure 233 is located near the left side 214 and couples the bottom horizontal piece 225 to the frame 210, and flexure 234 is located near the right side 216 and couples the bottom horizontal piece 225 to the frame 210.

Proofmass 220 includes a channel 242 between the top horizontal piece 223 and center rectangular piece 224. Channel 242 extends from the frame 210 to the bridge piece 226. Proofmass 220 also includes a channel 241 between the center rectangular piece 224 and bottom horizontal piece 225. Channel 241 extends from the frame 210 to the bridge piece 227.

Rectangular cuboid proofmass 222 is located within channel 242, coupled to the bridge piece 226 of proofmass 220 by hinge 207 and pair of gauges 254, and coupled to the frame 210, at an opposite end of proofmass 222, by hinge 205 and pair of gauges 253. Rectangular cuboid proofmass 221 is located within channel 241, coupled to the bridge piece 227 of proofmass 220 by hinge 201 and pair of gauges 251, and coupled to the frame 210, at an opposite end of proofmass 221, by hinge 203 and pair of gauges 252.

In operation, acceleration sensor 200 operates in a similar fashion to acceleration sensor 100 shown in FIGS. 1A-1E. In addition, acceleration sensor 200 has cross sections similar to those shown in FIGS. 1C-1E.

Figure 3:
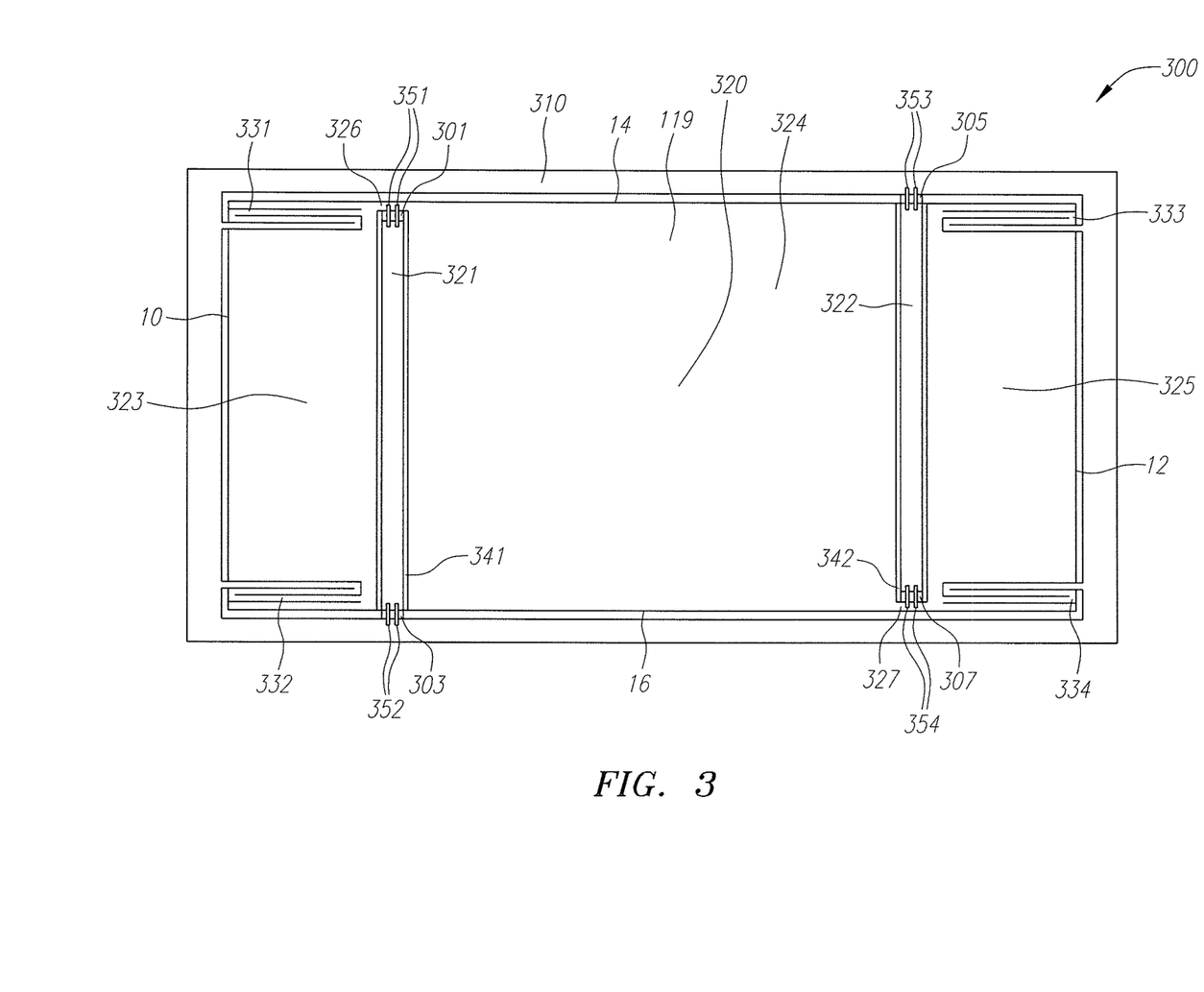
FIG. 3 illustrates a top view of one embodiment of a MEMS acceleration sensor.

FIG. 3 illustrates a view of the top surface 119 of the same embodiment of a MEMS acceleration sensor as shown in FIG. 2 except that it has been rotated back to the same orientation as the embodiment shown in FIG. 1, i.e. a 90-degree clockwise rotation. However, for clarity of the description, the embodiment shown in FIG. 3 will be described with some elements varying from the descriptions used in FIGS. 1 and 2.

The instant embodiment of MEMS acceleration sensor 300 shown in FIG. 3 includes a frame 310; a first proofmass 320 located within the frame 310 comprising a center block 324 flanked on a right side by a rectangular right side block 325 and flanked on a left side by a rectangular left side block 323 wherein, the right side block 325 is separated from the center block 324 by a first slit 342 that cuts in from a top 14 of the first proofmass 320 such that the right side block 325 is coupled to the center block 324 by a first bridge 327 at a bottom 16 of the first proofmass 320 and wherein the left side block 323 is separated from the center block 324 by a second slit 341 that cuts in from the bottom 16 of the first proofmass 320 such that the left side block 323 is coupled to the center block 324 by a second bridge 326 at the top 14 of the first proofmass 320;

The embodiment in FIG. 3 further comprises a second proofmass 322 located in the first slit 342. In the embodiment shown, the second proofmass 322 is coupled to the frame 310 by a first hinge 305 along the top 14 of the first proofmass 320 and coupled to the first bridge 327 by a second hinge 307. The embodiment in FIG. 3 further comprises a third proofmass 321 located in the second slit 341. In the embodiment shown, the third proofmass 321 is coupled to the frame 310 by a third hinge 303 along the bottom 16 of the first proofmass 320 and coupled to the second bridge 326 by a third hinge 301.

In the embodiment shown in FIG. 3, a first gauge 353, or as shown a first pair of gauges, is located above the first hinge 305 and spans between the second proofmass 322 and the frame 310. Similarly, a second gauge 354, or second pair of gauges, is located above the second hinge 307 and spans between the second proofmass 322 and the first proofmass 320. A third gauge 352 or third pair of gauges, is located above the third hinge 303 and spans between the third proofmass 321 and the frame 310. Similarly, a fourth gauge 351, or pair of gauges, is located above the fourth hinge 301 and spans between the third proofmass and the first proofmass 320. In addition, the acceleration sensor 300 must have a plurality of flexures to allow the translation perpendicular to the device plane. The embodiment shown in FIG. 3 comprises a plurality of flexures 331, 332, 333, 334 that couple the first proofmass 320 to the frame 310.

In a preferred embodiment, proofmass 320 is divided into three vertical blocks 323, 324 and 325 connected by narrow bridges 326 and 327. In other embodiments, proofmass 320 may have other shapes and forms. Although the embodiment shown in FIG. 3 shows three vertical blocks 323, 324, and 325, two bridge 326 and 327, four hinges 301, 303, 305, and 307, and four pairs of gauges 351, 352, 353, and 354, in other embodiments additional vertical blocks, bridges, hinges, or gauges may be used.

Figure 4:
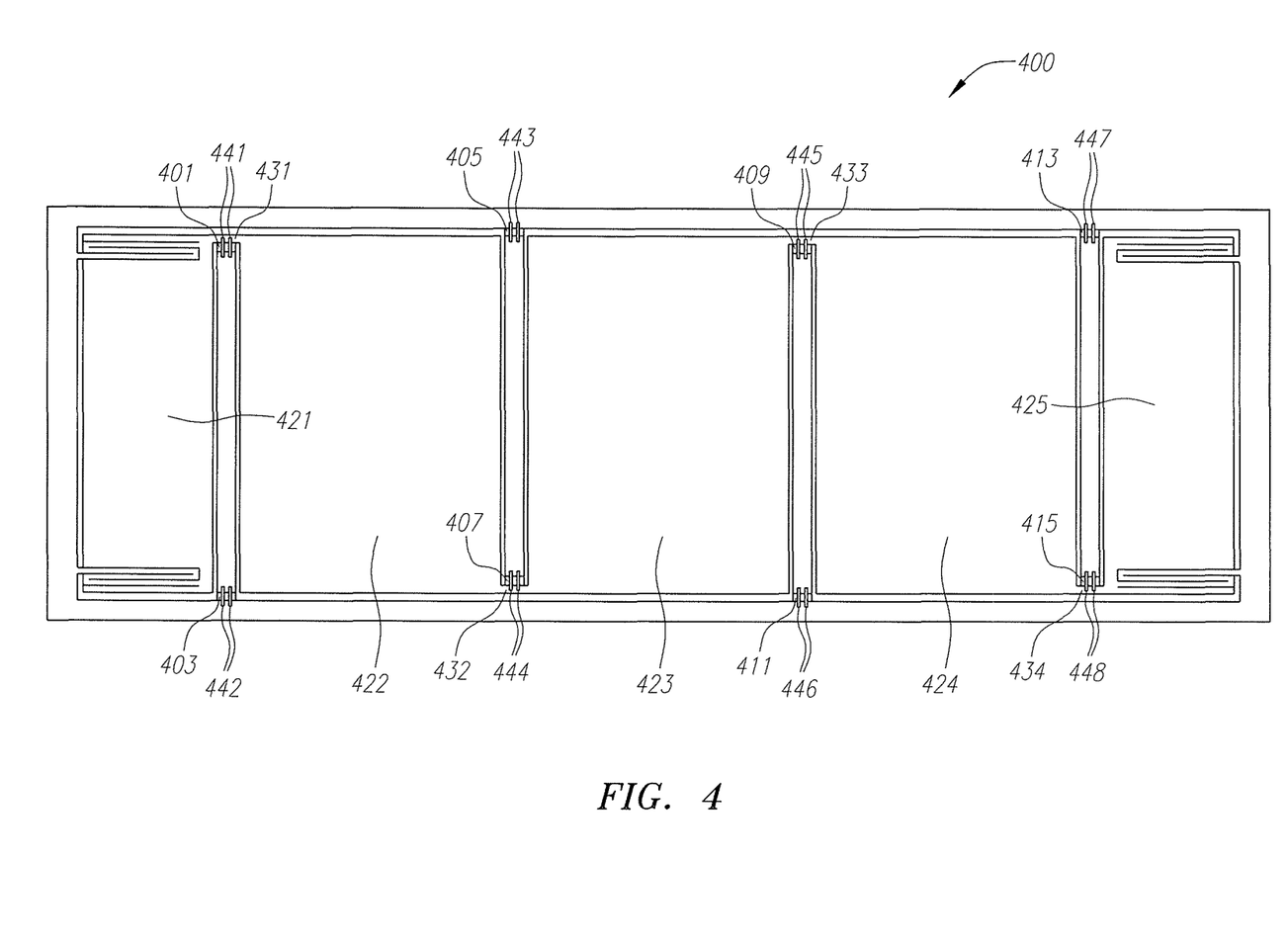
FIG. 4 illustrates a top view of one embodiment of a MEMS acceleration sensor wherein the primary proofmass has been divided into additional sections and the slits between those additional sections each contain additional proofmasses.

FIG. 4 illustrates an embodiment of MEMS acceleration sensor 400 that includes five vertical blocks 421, 422, 423, 424, and 425; four bridges 431, 432, 433, 434; eight hinges 401, 403, 405, 407, 409, 411, 413 and 415, and eight pairs of gauges 441, 442, 443, 444, 445, 446, 447, and 448. In a preferred embodiment including more additional gauges, gauges positioned the same distance from the center of the proofmass 420 may be averaged or used to produce a differential output to increase sensitivity and/or accuracy.

Although the embodiments shown in FIGS. 1A through FIG. 3 are shown with four pairs of gauges each, other embodiments may use fewer gauges. For example, a half bridge may be created using only two pairs of gauges. Moreover, additional parallel gauges may be used for redundancy. In addition, other electrical configurations may be used. Similarly, although the embodiment illustrated in FIG. 4 uses eight pairs of gauges, the same embodiment may be used with only four pairs of gauges or two pairs of gauges or any number of gauges depending on the application.

Thus, the present patent document provides a high temperature navigational MEMS acceleration sensor that is sensitive to vertical accelerations.

Although the embodiments have been described with reference to preferred configurations and specific examples, it will readily be appreciated by those skilled in the art that many modifications and adaptations of the high-output MEMS accelerometer described herein are possible without departure from the spirit and scope of the embodiments as claimed hereinafter. Thus, it is to be clearly understood that this description is made only by way of example and not as a limitation on the scope of the embodiments as claimed below.

What is claimed is:

1. A MEMS acceleration sensor comprising:
   a frame;
   a first proofmass located within the frame, the first proofmass separated from the frame by a gap, wherein the first proofmass includes a left side, right side, top, bottom, horizontal midline halfway between the top and the bottom and vertical midline halfway between the left side and right side;
   a first channel starting from the top of the first proofmass and extending down into the first proofmass towards the bottom past the horizontal midline to a first channel end, the first channel located right of the vertical midline;
   a second channel starting from the bottom of the first proofmass and extending up into the first proofmass towards the top past the horizontal midline to a second channel end, the second channel located left of the vertical midline;
   a first flexure coupling the first proofmass to the frame, the first flexure starting from the right side of the first proofmass and extending in towards the first channel along the top of the first proofmass;
   a second flexure coupling the first proofmass to the frame, the second flexure starting from the right side of the first proofmass and extending in towards the first channel along the bottom of the first proofmass;
   a third flexure coupling the first proofmass to the frame, the third flexure starting from the left side of the first proofmass and extending in towards the second channel along the top of the first proofmass;
   a fourth flexure coupling the first proofmass to the frame, the fourth flexure starting from the left side of the first proofmass and extending in towards the second channel along the top of the first proofmass;
   a second proofmass located within the first channel and coupled to the first proofmass via a first hinge and a first pair of gauges at the first channel end and, coupled to the frame at the top via a second hinge and a second pair of gauges; and,
   a third proofmass located within the second channel and coupled to the first proofmass via a third hinge and a third pair of gauges at the second channel end and coupled to the frame at the bottom via a fourth hinge and a fourth pair of gauges.

2. The MEMS acceleration sensor of claim 1, wherein the first through fourth hinges and first through fourth flexures are designed to allow the first proofmass to translate relative to the frame in a direction perpendicular to a device plane and, designed to restrict motion parallel to the device plane.

3. The MEMS acceleration sensor of claim 1, wherein the first through fourth flexures are hairsprings.

4. The MEMS acceleration sensor of claim 1, wherein the first through fourth pairs of gauges are made of a piezoresistive material.

5. The MEMS acceleration sensor of claim 1, wherein vertical movement of the first proofmass relative to the frame causes a piezoresistive effect in at least one of the pairs of gauges.

6. The MEMS acceleration sensor of claim 1, wherein the second proofmass and third proofmass are rectangular cuboids.

7. The MEMS acceleration sensor of claim 6, wherein the frame has a length of approximately 6 millimeters, a width of approximately 3 millimeters, and a thickness of approximately 1 millimeter.

8. The MEMS acceleration sensor of claim 1, wherein the frame is a stationary rim.

9. The MEMS acceleration sensor of claim 1, wherein all of the hinges are located above a centerline of a thickness of the first proofmass.

10. A MEMS acceleration sensor comprising:
    a frame;
    a first proofmass located within the frame comprising a center block flanked on a right side by a rectangular right side block and flanked on a left side by a rectangular left side block wherein, the right side block is separated from the center block by a first slit that cuts in from a top of the first proofmass such that the right side block is coupled to the center block by a first bridge at a bottom of the first proofmass and wherein the left side block is separated from the center block by a second slit that cuts in from the bottom of the first proofmass such that the left side block is coupled to the center block by a second bridge at the top of the first proofmass;
    a second proofmass located in the first slit, the second proofmass coupled to the frame by a first hinge along the top of the first proofmass and coupled to the first bridge by a second hinge;
    a third proofmass located in the second slit, the third proofmass coupled to the frame by a third hinge along the bottom of the first proofmass and coupled to the second bridge by a fourth hinge;
    a first pair of gauges located above the first hinge and spanning between the second proofmass and the frame;
    a second pair of gauges located above the second hinge and spanning between the second proofmass and the first proofmass;
    a third pair of gauges located above the third hinge and spanning between the third proofmass and the frame;
    a fourth pair of gauges located above the fourth hinge and spanning between the third proofmass and the first proofmass; and,
    a plurality of flexures that couple the first proofmass to the frame.

11. The MEMS acceleration sensor of claim 10, wherein the plurality of flexures are designed to allow the first proofmass to translate relative to the frame in a direction perpendicular to a device plane.

12. The MEMS acceleration sensor of claim 10, wherein the first through fourth pairs of gauges are all made of a piezoresistive material.

13. The MEMS acceleration sensor of claim 10, wherein all of the flexures in the plurality of flexures are hairsprings.

14. The MEMS acceleration sensor of claim 10, wherein the frame has a length of about 6 millimeters, a width of about 3 millimeters, and a thickness of about 1 millimeter.

15. The MEMS acceleration sensor of claim 10, wherein the four hinges are located above a centerline of a thickness of the proofmass.

16. A MEMS acceleration sensor comprising:
    a frame;
    a first proofmass located within the frame;
    a second proofmass nested within three sides of the first proofmass;
    a third proofmass nested within three sides of the first proofmass;
    four flexures that couple the first proofmass to the frame;

a first hinge and a first pair of gauges that couple the
      second proofmass to the frame;
   a second hinge and a second pair of gauges that couple the
      third proofmass to the frame;
   a third hinge and a third pair of gauges that couple the
      second proofmass to the first proofmass; and
   a fourth hinge and a fourth pair of gauges that couple the
      third proofmass to the first proofmass.

17. The MEMS acceleration sensor of claim 16, wherein the four flexures are designed to allow the first proofmass to translate relative to the frame in a direction perpendicular to a device plane and, designed to restrict motion parallel to the device plane.

18. The MEMS acceleration sensor of claim 16, wherein the four flexures are all hairsprings.

19. The MEMS acceleration sensor of claim 16, wherein vertical movement of the first proofmass relative to the frame causes a piezoresistive effect in at least one of the first through fourth pairs of gauges.

20. The MEMS acceleration sensor of claim 16, wherein the second proofmass and third proofmass are rectangular cuboids.

* * * * *